United States Patent
Yamauchi et al.

(10) Patent No.: US 6,572,701 B2
(45) Date of Patent: Jun. 3, 2003

(54) SYSTEM FOR SEPARATING AND RECOVERING WASTE FLUID AND SPIN COATER

(75) Inventors: Toshikazu Yamauchi, Miyazaki (JP); Yasuharu Oota, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/968,629

(22) Filed: Oct. 2, 2001

(65) Prior Publication Data
US 2002/0112662 A1 Aug. 22, 2002

(30) Foreign Application Priority Data
Feb. 21, 2001 (JP) ........................................ 2001-044540

(51) Int. Cl.[7] ................................................. B05C 5/00
(52) U.S. Cl. ..................... 118/52; 118/320; 118/326; 427/240; 427/425
(58) Field of Search ................. 118/52, 320, 326; 427/240, 425

(56) References Cited

U.S. PATENT DOCUMENTS

| 5,846,327 A | * 12/1998 | Kawamoto et al. ......... 118/319 |
| 5,882,433 A | * 3/1999 | Ueno ............................ 134/31 |
| 5,908,657 A | * 6/1999 | Kimura et al. ................... 427/9 |
| 6,159,541 A | * 12/2000 | Sakai et al. ................... 427/240 |
| 6,248,169 B1 | * 6/2001 | Juang et al. ................... 118/52 |

OTHER PUBLICATIONS

Nagamine et al., Dec. 6, 2001, United States Patent Application Publication 2001/0047753 A1.*

* cited by examiner

Primary Examiner—Richard Crispino
Assistant Examiner—Michelle Aewedo Lazor
(74) Attorney, Agent, or Firm—Rabin & Berdo, P.C.

(57) ABSTRACT

A waste fluid separation and recovery system of the present invention includes a first cup in which the substrate is disposed when the substrate is being coated with the photoresist, a photoresist waste fluid groove connected by a path of fluid communication with the first cup and an exhaust airflow generator for generating an exhaust airflow, which guides photoresist waste fluid from the substrate toward the photoresist waste fluid groove.

20 Claims, 4 Drawing Sheets

SYSTEM FOR SEPARATING AND RECOVERING WASTE FLUID AND SPIN COATER

BACKGROUND OF THE INVENTION

1. Field of the Invention

The present invention relates to a system for separating and recovering waste fluid and a spin coater.

The application is a counterpart application of Japanese Application Serial Number 044540/2001, filed Feb. 21, 2001, the subject matter of which is incorporated herein by reference.

2. Description of Related Art

Conventionally, in photolithographic processing, which is a part of a process by which a semiconductor IC is fabricated, photoresist is coated on a substrate using a photoresist coating apparatus that is generally called a spin coater. In this case, a large amount of waste fluid is generated during a step in which the photoresist is coated on the substrate and a step in which excess photoresist is washed and removed from the substrate with a rinse. Therefore, it is desirable to separate and recover the photoresist liquid and the like from the waste fluid to reuse.

As a method for separating and recovering various waste fluids generated during photoresist coating in the photoresist coating apparatus described above, there have been provided systems such as, for example, the following. Namely, a plurality of cups is disposed in a vertical direction and a mechanism is disposed for moving the substrate in the vertical direction. The substrate is moved by the mechanism and stopped at positions corresponding to the respective waste fluid separating cups. Coating of the photoresist on the substrate and subsequent rinsing of the substrate are separately carried out at respectively different positions, whereby the photoresist waste fluid and rinse waste fluid are separated.

The respective photoresist waste fluid and rinse waste fluid that have been separated into the respective waste fluid separating cups as described above are passed through separate waste fluid hoses for separately recovering the waste fluids, to then be stored in separate waste fluid tanks.

The photoresist is basically composed of a resin component and a solvent for diluting. Since the solvent in the photoresist waste fluid recovered by the above-described method has volatilized, the viscosity of the photoresist waste fluid is higher than that of the photoresist before use. By again adding solvent to the waste fluid having a high viscosity in order to restore it to its initial viscosity, the photoresist waste fluid can be reused without being discarded. This operation is called "photoresist reclamation".

However, in the conventional photoresist coating apparatus, there are limitations on the method of exhaust in the waste fluid separating cups due to problems relating to the way the waste fluid separating cups are structured. Since it has not been possible to sufficiently carry out exhaust, minute, gaseous particles of the waste fluids floating in the cups are not discharged together with the exhaust. A large amount of the particles thus adheres to a back surface of the substrate, whereby product quality deteriorates.

By separating the photoresist waste fluid and the rinse waste fluid, the photoresist waste fluid in the waste fluid separating cup tends to dry, and the resin in the photoresist waste fluid tends to solidify due to evaporation of the solvent in the photoresist waste fluid. This promotes build-up of the photoresist waste fluid in the waste fluid separating cup, and further, drying of the photoresist waste fluid in the waste fluid tank causes a loss in an amount thereof. Therefore, rate of recovery of the photoresist waste fluid is lowered.

Consequently, rate of reclamation of the photoresist is lowered due to a drop in the rate of recovery, and the amount of the solvent to be added is increased, whereby costs for reclaiming the photoresist increase.

SUMMARY OF THE INVENTION

Objects of the present invention are to provide a system for separating and recovering waste fluid and a spin coater, which solve problems in the conventional photoresist coating apparatus described above, which can completely recover photoresist waste fluid, which do not cause lower rate of recovery of the photoresist waste fluid due to drying of the photoresist waste fluid, and thus enable highly efficient photoresist separation and recovery.

To this end, the present invention provides a system for waste fluid separation and recovery when coating with a photoresist on a substrate using a fluid, the system comprising: a first cup in which the substrate is disposed when the substrate is being coated with the photoresist; a photoresist waste fluid groove connected by a path of fluid communication with the first cup; and an exhaust airflow generator for generating an exhaust airflow, which guides photoresist waste fluid from the substrate toward the photoresist waste fluid groove.

In this case, no gaseous particles remain floating in the vicinity of a photoresist coating position, and the gaseous particles can be prevented from floating toward and adhering onto a back surface of the substrate.

Further, the present invention provides a spin coater for coating with a photoresist on a substrate using photoresist and rinse liquid, the spin coater comprising: a chuck adapted for detachably mounting a substrate thereto, the chuck being movable between a first position for applying the photoresist to the substrate when mounted thereto, and a second position for applying the rinse liquid to the substrate; nozzles disposed for applying the photoresist and rinse liquid to the substrate mounted on the chuck; first and second cups extending around the chuck, wherein the first and second cups include walls of a height different from one cup to the other, wherein first cup captures photoresist waste fluid form the substrate when spun at the first position, and second cup captures rinse waste fluid form the substrate when spun at the second position; a photoresist waste fluid groove connected by a path of fluid communication with the first cup;

a rinse waste fluid groove connected by a path of fluid communication to the second cup; and an exhaust airflow generator which generates an exhaust airflow that guides the photoresist waste fluid from the substrate toward the photoresist waste fluid groove.

DETAILED DESCRIPTION OF THE PREFERRED EMBODIMENTS

Embodiments of the present invention are described in detail below with reference to figures.

Figure 1:
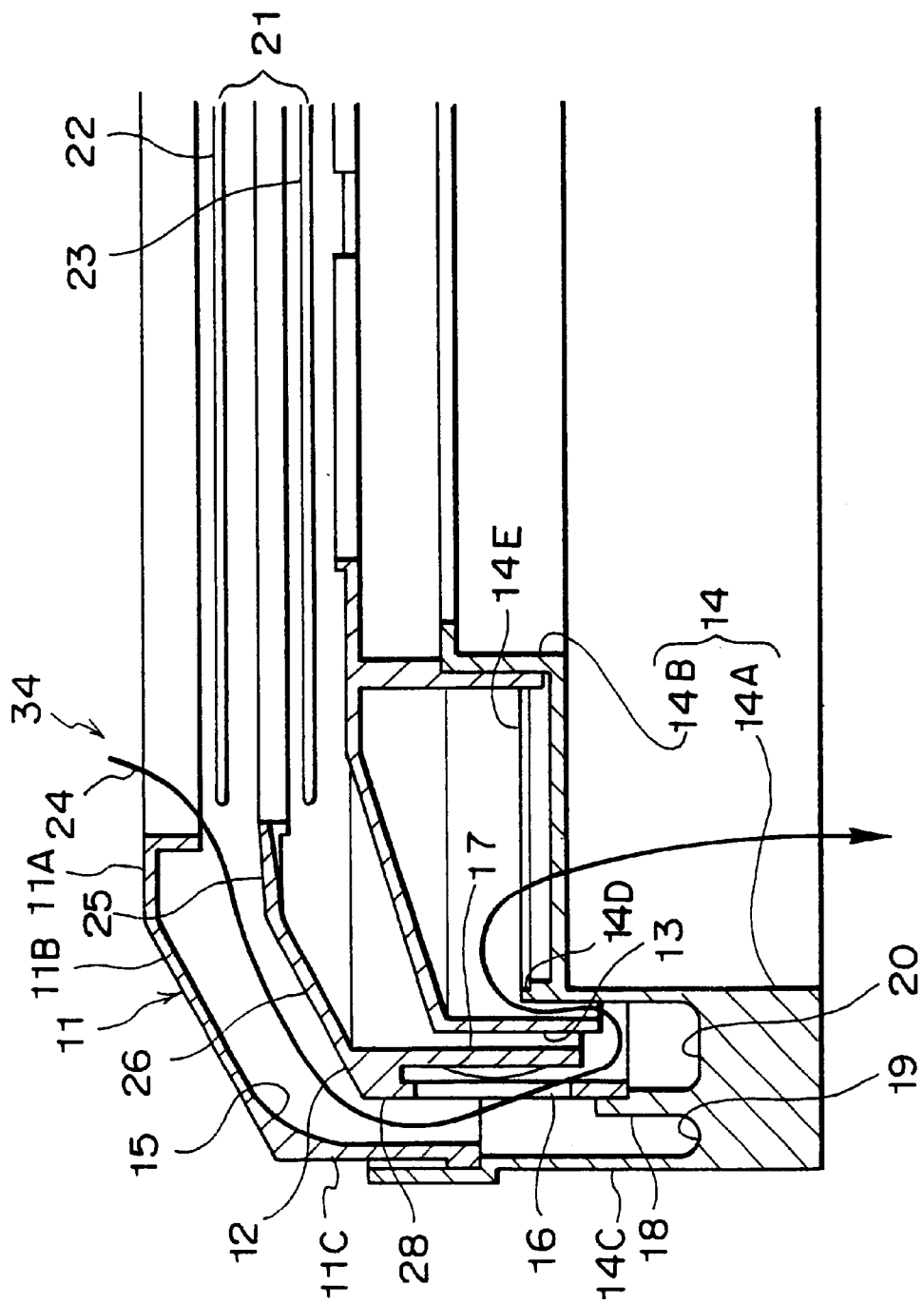
FIG. 1 is a sectional view showing a waste fluid separating cup of a photoresist coating apparatus in a first embodiment of the present invention.

FIG. 1 is a sectional view showing a waste fluid separating cup 34 of a photoresist coating apparatus in a first embodiment of the present invention.

The photoresist coating apparatus in the embodiments of the present invention is an apparatus usually called a spin coater which is used to coat a photoresist on a substrate in photolithographic processing, which is a part of a process by which a semiconductor IC is fabricated. A substrate 21 is supported so as to be movable in a vertical direction from a coating position 22 to a rinsing position 23.

As shown in the figure, the waste fluid separating cup 34 includes a first cup 11, a second cup 12, a straightening vane 13 and a lower cup 14. The waste fluid separating cup is generally made of a resin such as fluororesin in view of consideration given to metal contamination of a semiconductor substrate, photoresist waste fluid to be reclaimed, and the like.

The lower cup 14 includes a main body 14A and an extending portion 14B which extends inward from an upper portion of the main body 14A. The main body 14A is provided with two grooves: an outer groove that is a photoresist waste fluid groove 19, and an inner groove that is a rinse waste fluid groove 20. The photoresist waste fluid groove 19 and the rinse waste fluid groove 20 are partitioned by a partition 18 which is disposed lower than an outer wall 14C of the lower cup 14.

The first cup 11 includes a horizontal portion 11A disposed at a side of the coating position 22, an inclined portion 11B inclined outward and downward from the horizontal portion 11A, and a vertical portion 11C extending downward from a lower end of the inclined portion 11B. The vertical portion 11C is fitted in the outer wall 14C of the lower cup 14. A rounded portion 15 is provided at an inner wall of a region where the inclined portion 11B and the vertical portion 11C meet.

The second cup 12 includes a first inclined portion 25 disposed at a side of the rinsing position 23, a second inclined portion 26 whose inclination is steeper than that of the first inclined portion 25, a vertical portion 28 extending downward from a lower end of the second inclined portion 26, and a rinse stopper 17 disposed at an inner side of and parallel to the vertical portion 28. The vertical portion 28 is fitted inside the partition 18 of the lower cup 14.

Exhaust holes 16 are disposed at equidistant intervals all around the vertical portion 28 of the second cup 12. In the present embodiment, approximately 24 exhaust holes 16 are disposed at the vertical portion 28, with respective diameters of the exhaust holes 16 being 20.0 mm. The rinse stopper 17 is provided so that a lower end thereof is positioned about 2.0 mm lower than lowermost portions of the exhaust holes 16.

The straightening vane 13 is formed integrally with the lower cup 14, and is disposed at an inner side of the rinse stopper 17. A lower end of the straightening vane 13 is positioned below a bottom wall 14E of the extending portion 14B of the lower cup 14. Further, an exhaust port 14D is formed in the bottom wall 14E of the extending portion 14B. An exhaust means (not shown) for generating an exhaust airflow is provided below the exhaust port 14D.

Next, operation of the waste fluid separation and recovery system in the photoresist coating apparatus including the waste fluid separating cup having the above-described structure is described.

First, the substrate 21 comprising, for example, a semiconductor substrate, is sucked and fixed on a chuck attached to a rotating shaft (not shown). The shaft is rotated into the coating position 22 by a driving force of a motor (not shown). Then, a photoresist is applied onto the rotating substrate 21 from a nozzle (nozzles) (not shown). The photoresist covers the entire surface of the substrate due to a centrifugal force. Excess photoresist is spun off horizontally to run off and outward from an edge of the substrate 21. The photoresist that runs off and outward hits an inner wall of the first cup 11, and runs down along the inner wall into the photoresist waste fluid groove 19 of the lower cup 14.

When the photoresist coating has been applied on the substrate 21, the chuck moves downward until the substrate 21 reaches the rinsing position 23. Then, similar to the photoresist coating, the substrate 21 is rotated and subjected to rinsing.

The rinsing includes back rinsing using a nozzle (nozzles) for washing a lower surface, i.e., "back", of the substrate 21, and edge rinsing using a needle-like nozzle (nozzles) for washing a peripheral portion of the substrate 21.

Then, the rinse liquid is spun off horizontally to run off and outward from the edge of the substrate 21. The rinse liquid and the photoresist solution running off and outward hit an inner wall of the second cup 12, and run down along the inner wall into the rinse waste fluid groove 20 of the lower cup 14.

The photoresist waste fluid groove 19 and the rinse waste fluid groove 20 are respectively provided with a waste fluid port, and a waste fluid hose is connected to each of the waste fluid ports. The photoresist waste fluid and the rinse waste fluid are passed through the respective waste fluid hoses to be stored in separate waste fluid tanks.

An exhaust airflow 24, which is a flow of exhaust in the waste fluid separating cup 34, flows from an opening at an upper portion of the waste fluid separating cup 34, passes through a space between the first cup 11 and the second cup 12, toward a lower portion of the waste fluid separating cup 34, and further passes through the exhaust holes 16 provided at the second cup 12, and through the lower end of the rinse stopper 17, and then flows upward in a space between the straightening vane 13 and the lower cup 14, and finally flows into an exhaust port 14D of the entire waste fluid separating cup at a portion of a bottom surface of the lower cup 14.

Thus, minute, airborne, gaseous particles of the photoresist waste fluid that are generated when the photoresist is coated onto the substrate 21 are flown toward the lower portion of the waste fluid separating cup by the exhaust airflow 24. The rinse waste fluid running down on the inner wall surface of the second cup 12 is blocked by the rinse stopper 17, and therefore does not pass through the exhaust holes 16 to reach the photoresist waste fluid groove 19. Thus, the rinse waste fluid is not mixed in with the photoresist waste fluid in the photoresist waste fluid groove 19. Since the rinse waste fluid is a mixture of the rinse and the photoresist solution, no problem is caused if minute, gaseous particles of the photoresist waste fluid are mixed in with the rinse waste fluid in the rinse waste fluid groove 20.

Since the exhaust airflow 24 flows upward in the space between the straightening vane 13 and the lower cup 14 and finally flows out of the exhaust port 14D at the portion of the bottom surface of the lower cup 14, the photoresist waste fluid and the rinse waste fluid drop from the exhaust by the time the exhaust reaches the exhaust port 14D. Therefore, the photoresist waste fluid and the rinse waste fluid do not leak from the exhaust port 14D to the outside.

As described above, in the present embodiment, by disposing the exhaust holes 16 at the side surface of the second cup 12 to allow the exhaust airflow 24 to flow through the cups 11, 12 and 14 and out of the exhaust port 14D, minute, airborne gaseous particles of the photoresist waste fluid generated when the photoresist is spin-coated onto the substrate 21 are flown toward the lower portion of the waste fluid separating cup by the exhaust airflow 24. Therefore, no gaseous particles remain floating in the vicinity of the photoresist coating position 22, and the gaseous particles can be prevented from floating toward and adhering onto the back (lower) surface of the substrate 21.

By providing the rinse stopper 17 together with the exhaust holes 16, the rinse waste fluid runs down the inner wall of the rinse stopper 17 into the rinse waste fluid groove 20. Since the rinse stopper 17 is formed longer than the lower ends of the exhaust holes 16, the rinse waste fluid does not go round the rinse stopper 17 from the lower side thereof to pass through the exhaust holes 16 and to enter the photoresist waste fluid groove 19. Thus, the rinse waste fluid is prevented from being mixed in with the photoresist waste fluid, and the photoresist waste fluid and the rinse waste fluid can be reliably separated.

Further, by disposing the Rounded portion 15 at the inner wall of the first cup 11, the region at which the inclined portion 11B and the vertical portion 11C meet is gently rounded, whereby the flow of the photoresist waste fluid is made smooth and the photoresist waste fluid can be prevented from accumulating on the inner wall.

A second embodiment of the present invention is described next. Parts thereof having the same structure as those in the first embodiment are designated by the same reference numerals, and explanation thereof is omitted.

Figure 2:
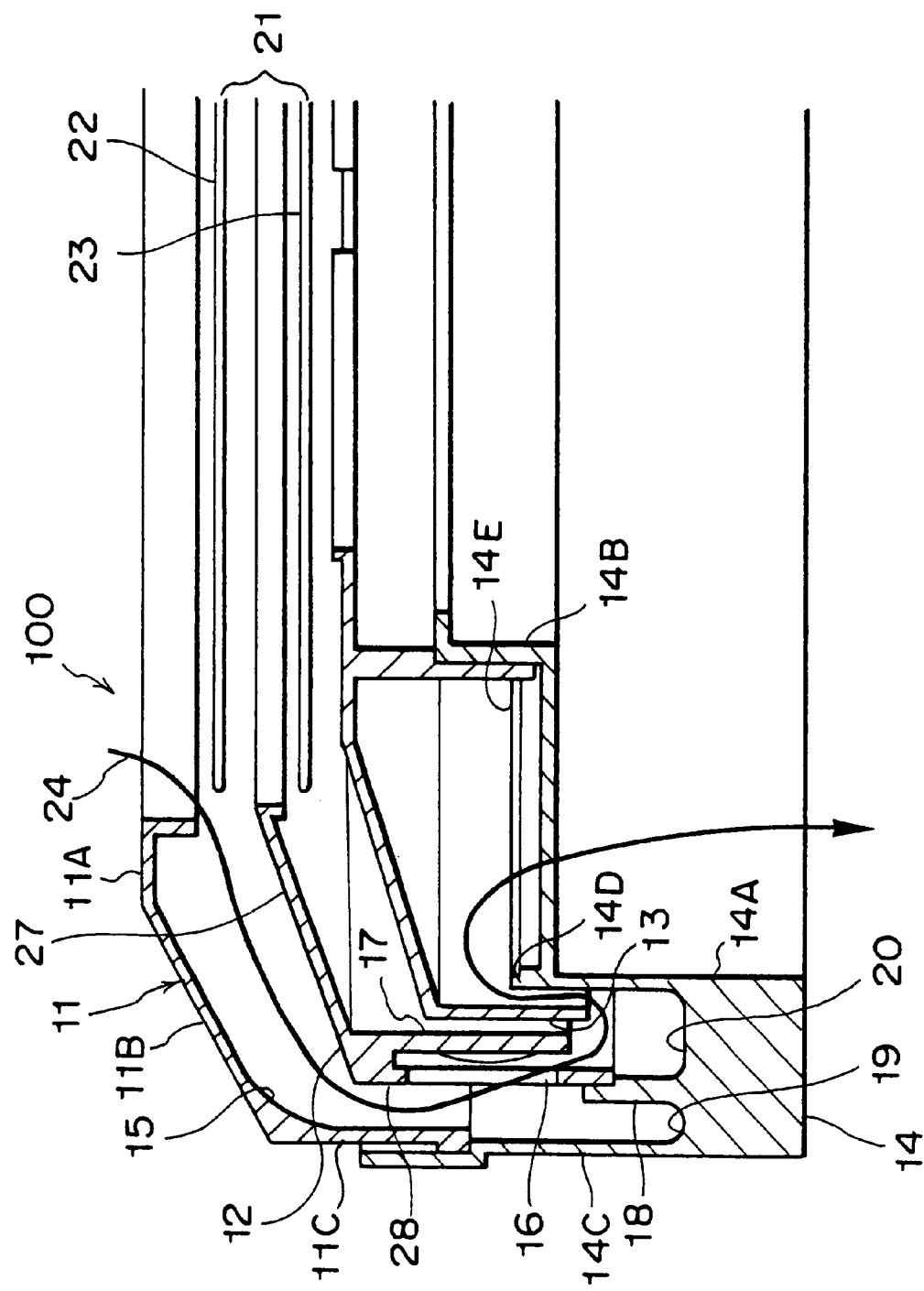
FIG. 2 is a sectional view showing another waste fluid separating cup of a photoresist coating apparatus in a second embodiment of the present invention.

FIG. 2 is a sectional view showing a waste fluid separating cup 100 of a photoresist coating apparatus in the second embodiment of the present invention.

In the second embodiment, an inclined portion 27 of the second cup 12 has a straight-line profile in comparison with the profile formed by the two inclined portions 25 and 26 of the first embodiment. Namely, whereas the inclined portion of the first embodiment includes the two inclined portions 25 and 26 that have respectively different degrees of inclination, the corresponding inclined portion of the second cup 12 in the second embodiment comprises the single inclined portion 27. Thus, flow of the photoresist waste fluid along the inclined portion 27 in the present embodiment is, similar to the first embodiment, not hindered, whereby accumulation of the photoresist waste fluid on a surface of the inclined portion 27 can be prevented.

As described above, contamination in the waste fluid separating cup due to adhesion or accumulation of the photoresist waste fluid can be reduced by the structural feature of the waste fluid separating cup, and service life of the waste fluid separating cup can be extended.

A third embodiment of the present invention is described next. Explanation of parts thereof having the same structure as those in the first and the second embodiments as well as explanation of the same operations are omitted.

Figure 3:
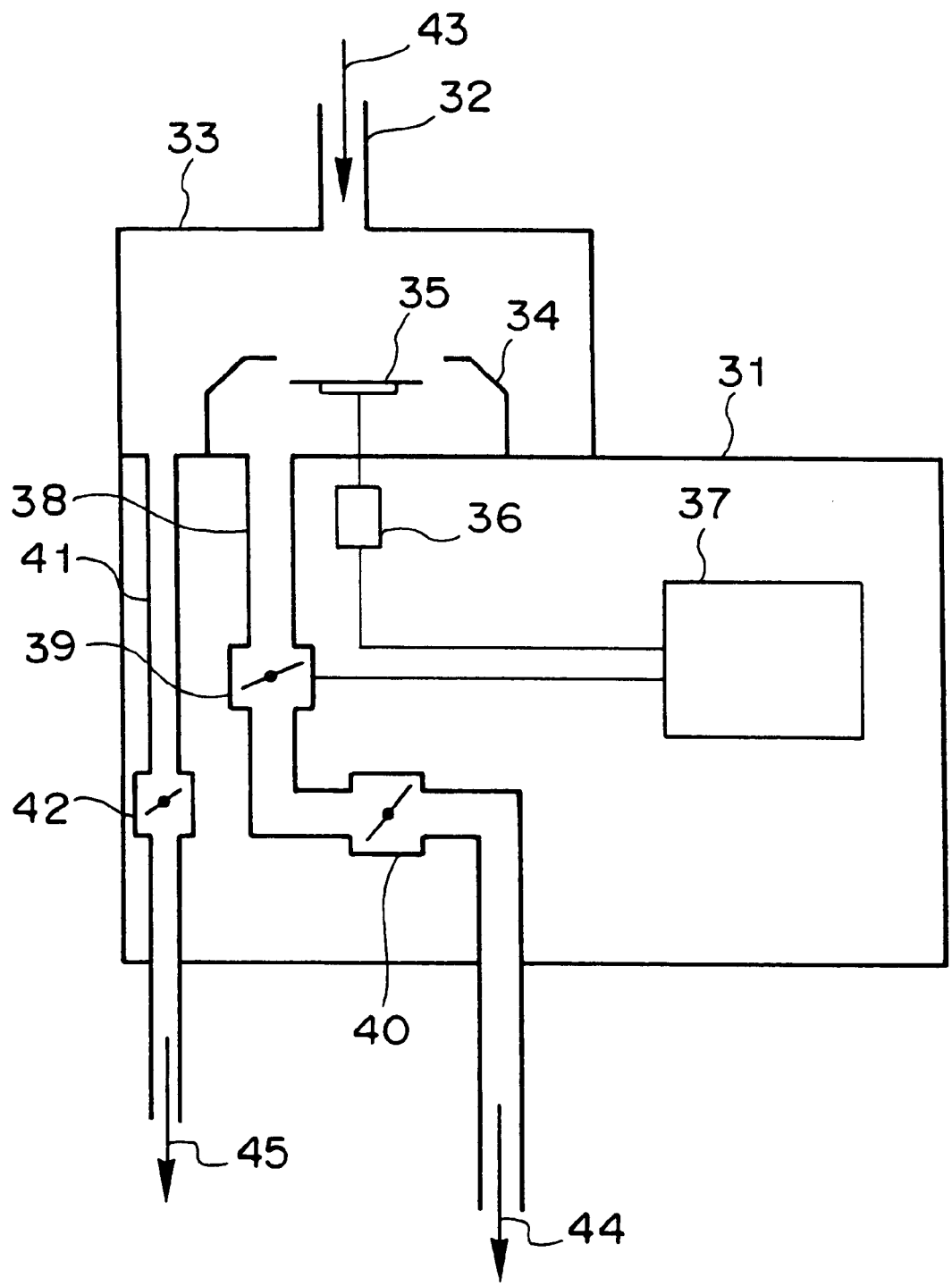
FIG. 3 is a schematic view of a photoresist coating apparatus in a third embodiment of the present invention.

FIG. 3 schematically shows a photoresist coating apparatus in the third embodiment of the present invention.

As shown in the figure, a photoresist coating section is formed in a cover 33, to which an air duct 32 is attached above an apparatus main body 31, and a waste fluid separating cup 34 is mounted in the cover 33. In the waste fluid separating cup 34, a substrate 35 such as a semiconductor substrate is sucked and fixed on a chuck attached to a rotating shaft. The rotating shaft is directly connected to a motor 36. The motor 36 is communicably connected to a controller 37 and is controlled by the controller 37.

A cup exhaust duct 38 is connected to a bottom surface in the waste fluid separating cup 34, and an exhaust valve 39 which is controlled by the controller 37 is provided in the cup exhaust duct 38. Further, a manual damper 40 is attached at a downstream side from the exhaust valve 39 in the cup exhaust duct 38. The cup exhaust duct 38 communicates with the exhaust port 14D (see FIG. 1).

A second exhaust duct 41 is connected to the bottom surface in the cover 33 outside the waste fluid separating cup 34. A manual damper 42 is provided in the second exhaust duct 41. A diameter of the second exhaust duct 41 may be smaller than that of the cup exhaust duct 38.

Next, operation of the photoresist coating apparatus having the above-described structure is described.

First, air 43 that controls temperature and humidity is sent from the air duct 32 into the cover 33. While the photoresist coating is carried out in the waste fluid separating cup 34, supply of the photoresist from a nozzle (nozzles) (not shown) and rotation of the motor 36 are controlled by the controller 37.

The photoresist is coated onto the substrate 35 in the photoresist coating apparatus of the third embodiment by a process having the following sequential steps. The photoresist is supplied to an upper surface of the substrate 35 in a supplying step, the substrate 35 is rotated by rotating the motor 36 to spread the photoresist across the entire surface of the substrate 35 in a pre-spinning step, excess photoresist is spun off and outward from the edge of the substrate 35 in a main spinning step, the substrate 35 is rinsed by a rinse liquid supplied onto the substrate 35 from a nozzle (nozzles), and the rinse liquid is horizontally spun off and outward from the edge of the substrate 35 in a spin-drying step.

During the photoresist coating step, the rinsing step and the spin-drying step, the exhaust valve 39 is closed by an instruction from the controller 37, and discharge of cup exhaust 44 from the cup exhaust duct 38 is completely blocked. During the pre-spinning step and the main-spinning step, the exhaust valve 39 is fully opened and the cup exhaust 44 is discharged from the cup exhaust duct 38. At which step the exhaust valve 39 is opened or closed can be suitably changed as necessary. The amount of the cup exhaust 44 that is discharged when the exhaust valve 39 is fully opened is determined in advance by pre-adjusting the manual damper 40.

Whereas the cup exhaust 44 is variously blocked and allowed to flow depending on the step in the process by which the substrate 35 is coated with the photoresist, a unit exhaust 45 is always discharged form the second exhaust duct 41. The amount of the unit exhaust 45 that is discharged is determined in advance by pre-adjusting the manual damper 42. When the amount of unit exhaust 45 that is discharged from the second exhaust duct 41 is too large, the exhaust in the waste fluid separating cup 34 flow toward the second exhaust duct 41. To prevent this, the discharge amount of the unit exhaust 45 is set to be smaller than the discharge amount of the cup exhaust 44.

Further, total discharge amount of the cup exhaust 44 and the unit exhaust 45 is set to be smaller than the amount of the air 43 being sent so that the air 43 sent from the air duct 32 fills the cover 33.

As described above in the present embodiment, the exhaust valve 39 is opened to allow the cup exhaust 44 to be exhausted only during the pre-spinning step and the main-spinning step among the steps of the photoresist coating process. Therefore, it is possible to suppress the photoresist waste fluid accumulating in the waste fluid separating cup 34 or adhering to the inner surface of the waste fluid separating cup 34 from being dried by the exhaust wind.

Therefore, the amount of the photoresist resin that solidifies and adheres in the waste fluid separating cup 34 is reduced, and the photoresist waste fluid is smoothly discharged from the waste fluid separating cup 34. Thus, contamination in the waste fluid separating cup 34 by the photoresist waste fluid is reduced, and the service life of the waste fluid separating cup 34 can be extended. In addition, since fixation of the photoresist waste fluid in the waste fluid separating cup 34 is reduced and dischargeability thereof is increased, loss in waste fluid recovery can be reduced, thereby improving efficiency of the recovery of the photoresist waste fluid.

Further, by suppressing drying of the photoresist waste fluid, increase in the viscosity thereof is suppressed. Therefore, when reclaiming the photoresist from the photoresist waste fluid, the amount of the solvent added to the photoresist waste fluid can be reduced, and this reduces the cost for the reclamation. In addition, when the cup exhaust 44 is blocked by the exhaust valve 39, a solvent atmosphere of the photoresist is discharged by the unit exhaust 45. Therefore, the solvent atmosphere can be prevented from leaking outside of the cover 33, and environmental safety can be ensured.

A fourth embodiment of the present invention is described next. Explanation of parts thereof having the same structure as those in the first to the third embodiments as well as explanation of the same operations are omitted.

Figure 4:
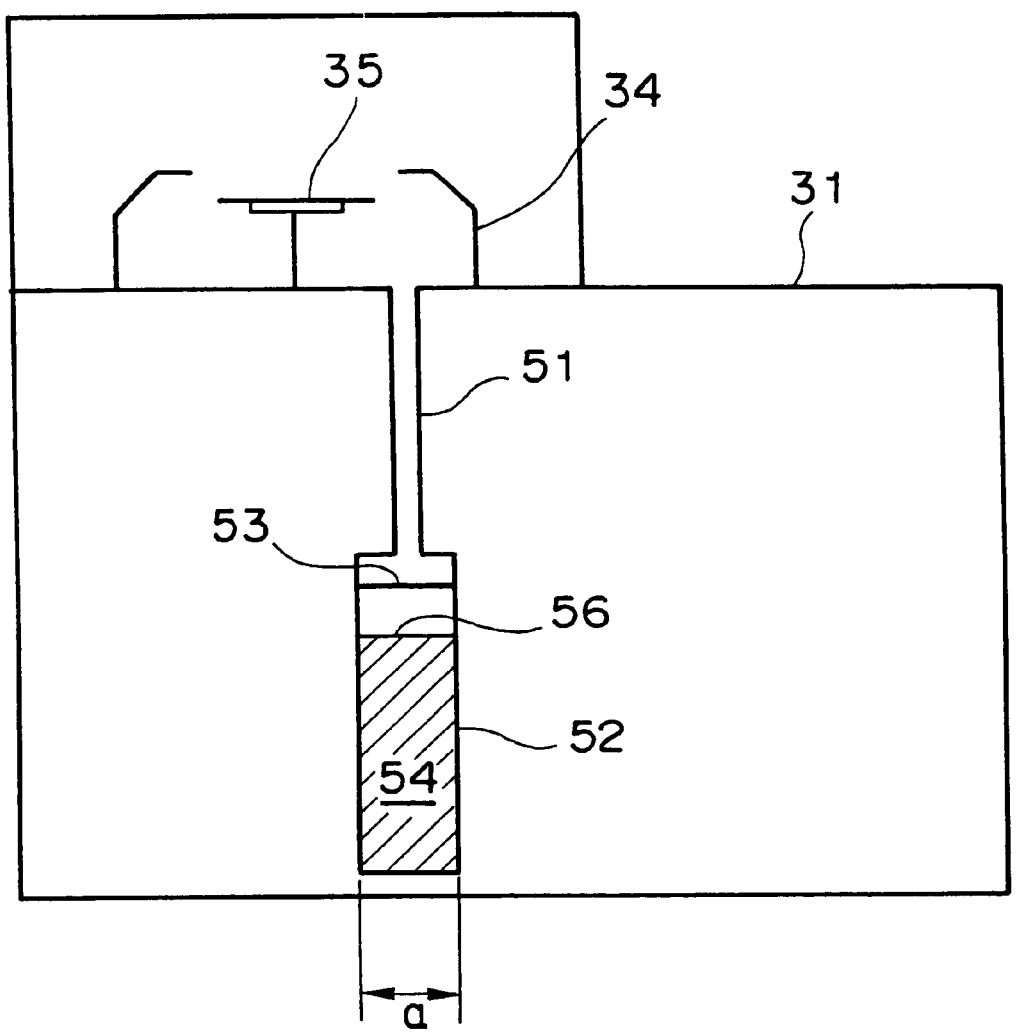
FIG. 4 is a schematic view of a waste fluid system of a photoresist coating apparatus in a fourth embodiment of the present invention.

FIG. 4 schematically shows a waste fluid system of a photoresist coating apparatus of the fourth embodiment of the present invention.

As shown in the figure, an upper end of a waste fluid pipe 51 is connected to the bottom surface in the waste fluid separating cup 34, and a lower end of the waste fluid pipe 51 is connected, via a joint surface 53, to a waste fluid tank 52 provided in the apparatus main body 31. A waste fluid pipe 51 is connected to the waste fluid groove 19 in FIG. 1. The length of the waste fluid pipe 51 is as short as possible. In this structure, no exhaust duct is connected to the waste fluid tank 52, and airtightness at the joint surface 53 between the waste fluid pipe 51 and the waste fluid tank 52 is increased, thereby maintaining sealability in the waste fluid tank 52.

The waste fluid pipe 51 has a small inner diameter of, for example, about 10.0 mm or less. However, the inner diameter of the waste fluid pipe 51 should be large enough so that the discharged photoresist waste fluid does not clog in the waste fluid pipe 51. A total capacity of the waste fluid tank 52 is small, and a shape thereof is, for example, a hollow cylinder having a small diameter or a container having a small cross-sectional area, preferably.

Next, operation of the photoresist coating apparatus having the above-described structure is explained.

First, a photoresist waste fluid 54 generated during photoresist coating in the waste fluid separating cup 34 is discharged from the waste fluid separating cup 34 through the waste fluid pipe 51, and is recovered in the waste fluid tank 52. When an amount of the photoresist waste fluid 54 in the waste fluid tank 52 reaches a predetermined value, the waste fluid tank 52 is replaced with another empty waste fluid tank 52.

When a solvent atmosphere naturally volatilized from the photoresist waste fluid 54 in the waste fluid tank 52 flows through the waste fluid pipe 51 and back to the waste fluid separating cup 34, the solvent atmosphere is discharged from the cup exhaust duct 38 (see FIG. 3) connected to the bottom surface in the waste fluid separating cup 34.

Thus, in the present embodiment, since no exhaust duct is connected to the waste fluid tank 52, and the joint surface 53 between the waste fluid pipe 51 and the waste fluid tank 52 is airtight, the waste fluid tank 52 is sealed. Therefore, there is no risk of leakage of the solvent atmosphere, and drying of the photoresist waste fluid 54 in the waste fluid tank 52 can be suppressed by not discharging air in the waste fluid tank 52.

Therefore, since the waste fluid tank 52 is not provided with an exhaust duct for forcedly discharging the solvent atmosphere volatilized from the photoresist waste fluid 54 to prevent leakage thereof, which has been conventionally provided, the viscosity of the photoresist waste fluid 54 does not increase, which otherwise is increased by accelerating natural volatilization of the solvent atmosphere from the photoresist waste fluid 54 in the waste fluid tank 52.

Back flow of the naturally volatilized solvent atmosphere toward the waste fluid separating cup 34 can be limited by making the diameter of the waste fluid pipe 51 very small. Since the diameter and the length of the waste fluid pipe 51 are small, the photoresist waste fluid 54 discharged from the waste fluid separating cup 34 contacts less air in the waste fluid pipe 51, thereby suppressing drying of the waste fluid.

Further, by making the capacity of the waste fluid tank 52 small, the time during which the photoresist waste fluid 54 is stored in the waste fluid tank 52 is shortened to suppress the volatilization of the solvent on the basis of time. Furthermore, by forming the waste fluid tank 52 in the cylindrical form having the small diameter, a surface area of a liquid surface 56 of the photoresist waste fluid 54 stored in the waste fluid tank 52 which contacts the air is reduced, and the volatilization of the solvent can be suppressed.

Thus, since the volatilization of the solvent from the photoresist waste fluid 54 is suppressed, increase of the viscosity of the photoresist waste fluid 54 in the waste fluid tank 52 can be suppressed. In addition, since the recovered photoresist waste fluid 54 is in a state which is very similar to that of an unused photoresist, a photoresist reclaiming operation using this photoresist waste fluid 54 can be carried out more easily.

A fifth embodiment of the present invention is described next. Explanation of parts thereof having the same structure as those in the first to the fourth embodiments as well as explanation of the same operations are omitted.

In the fifth embodiment, the waste fluid tank 52 is not used, and the waste fluid pipe 51 is extended to the outside of the apparatus to discharge the waste fluid directly from the apparatus via a central piping or the like. In this case, the waste fluid pipe 51 is long. Therefore, the diameter of the waste fluid pipe 51 is made smaller than the previous embodiment to suppress drying of the photoresist waste fluid 54 in the waste fluid pipe 51.

Further, by providing a sufficient inclination to the waste fluid pipe 51 and reducing a number of joints in the waste fluid pipe 51 to reduce formation of projections and depressions in the waste fluid pipe 51, the photoresist waste fluid 54 can be smoothly discharged. Thus, the photoresist waste fluid 54 which is highly reclaimable into the photoresist can be recovered without a loss in recovery nor changes in quality such as viscosity increase.

A sixth embodiment of the present invention is described next. Explanation of parts thereof having the same structure as those in the first to the fifth embodiments and explanation of the same operations are omitted.

In the sixth embodiment, the same solvent as that for diluting the photoresist is used as the rinse.

Thus, no impurity, which may change patterning performance of the photoresist, is mixed in the photoresist waste fluid 54 and the rinse waste fluid. Therefore, the photoresist waste fluid 54 can be reused as the photoresist by simply adjusting the viscosity thereof.

Further, solidification of the resin component in the photoresist on inner walls of the waste fluid separating cup 34, the waste fluid pipe 51, and the like, can be prevented by the rinse which is the same solvent as that for diluting the photoresist.

A seventh embodiment of the present invention is described next. Explanation of parts thereof having the same structure as those in the first to the sixth embodiments and explanation of the same operations are omitted.

In the seventh embodiment, the inner surface of the waste fluid separating cup 34 is washed with the same solvent as that for diluting the photoresist to wash and remove the photoresist waste fluid 54 and the like adhering on the wall surface of the waste fluid separating cup 34. Waste fluid of the solvent used for washing is mixed with the photoresist waste fluid 54, the rinse waste fluid, and the like, and they are discharged together.

Since the inner surface of the waste fluid separating cup 34 is washed with the same solvent as that for diluting the photoresist, no impurity, which may change patterning performance of the photoresist, is mixed in the photoresist waste fluid 54 and the rinse waste fluid. Therefore, the photoresist waste fluid 54 can be reused as the photoresist only by adjusting the viscosity thereof.

Further, solidification of the resin component in the photoresist on inner walls of the waste fluid separating cup 34, the waste fluid pipe 51, and the like, can be prevented by the rinse which is the same solvent as that for diluting the photoresist.

An eighth embodiment of the present invention is described next. Explanation of parts thereof having the same structure as those in the first to the seventh embodiments and explanation of the same operations are omitted.

In the eighth embodiment, a washing nozzle (nozzles) for washing the inner surface of the waste fluid pipe 51 of the waste fluid system of the photoresist coating apparatus is provided in the waste fluid pipe 51. The inner surface of the waste fluid pipe 51 is washed with a solvent spouting from the washing nozzle (nozzles).

Since the washing nozzle (nozzles) is provided in the waste fluid pipe 51 to wash the inner surface of the waste fluid pipe 51, the resin component of the photoresist adhering on the inner wall of the waste fluid pipe 51 can be removed, and the waste fluid pipe 51 is not clogged.

A ninth embodiment of the present invention is described next. Explanation of parts thereof having the same structure as those in the first to the eighth embodiments and explanation of the same operations are omitted.

In the ninth embodiment, an on-line viscometer is provided in the waste fluid tank 52 to adjust an amount of the solvent for diluting the photoresist waste fluid 54, and the viscosity of the photoresist waste fluid 54 is controlled to be a desired degree, such as to be equal to, slightly higher, slightly lower, or the like, than the initial viscosity. In this embodiment, the viscosity of the photoresist in the waste fluid tank is adjusted by controlling timing of washing of the waste fluid separating cup 34, an amount of a washing fluid, time for washing, and the like.

Since the viscosity of the photoresist in the waste fluid tank is controlled, the photoresist waste fluid 54 can be reused immediately and easily.

Any of the above-described embodiments of the present invention can also be applied to spin-coaters used in fields other than those used in semiconductor fabrication, and can greatly increase a recovery efficiency in a separation and recovery technique for a coating chemical having a particular property.

The present invention is not limited to the above-described embodiments, and can be modified in various manners on the basis of the purpose of the present invention. Such modifications and variations are also included in the scope of the present invention.

In the third to the ninth embodiments, the waste fluid separating cup 34 may be replaced with the waste fluid separating cup 100.

What is claimed is:

1. A system for waste fluid separation and recovery when coating with a photoresist on a substrate using a fluid, the system comprising:
    a first cup in which the substrate is disposed when the substrate is being coated with the photoresist;
    a photoresist waste fluid groove in fluid communication with the first cup;
    an exhaust airflow generator for generating an exhaust airflow, which guides photoresist waste fluid from the substrate toward the photoresist waste fluid groove;
    a second cup which is disposed at an inner side of the first cup, and which includes exhaust holes and in which the substrate is disposed when the substrate is being rinsed; and
    a rinse waste fluid groove in fluid communication to the second cup, wherein the exhaust airflow exits from the first cup through the exhaust holes.

2. The system of claim 1, further comprising a liquid stopper disposed downstream of the exhaust holes, relative to the airflow, for preventing rinse waste fluid from being mixed with the photoresist waste fluid.

3. The system of claim 1, wherein the second cup includes an inclined outer surface.

4. A system for waste fluid separation and recovery when coating with a photoresist on a substrate using a fluid, the system comprising:
    a first cup in which the substrate is disposed when the substrate is being coated with the photoresist;
    a photoresist waste fluid groove in fluid communication with the first cup;
    an exhaust airflow generator for generating an exhaust airflow, which guides photoresist waste fluid from the substrate toward the photoresist waste fluid groove;
    a first exhaust duct for discharging the exhaust airflow;
    an exhaust valve disposed in the first exhaust duct; and
    a second exhaust duct for discharging exhaust airflow, the second exhaust duct including an entrance for receiving exhaust air that is external to the first cup.

5. A system for waste fluid separation and recovery when coating with a photoresist on a substrate using a fluid, the system comprising:
    a first cup in which the substrate is disposed when the substrate is being coated with the photoresist;

a photoresist waste fluid groove in fluid communication with the first cup;

an exhaust airflow generator for generating an exhaust airflow, which guides photoresist waste fluid from the substrate toward the photoresist waste fluid groove;

a waste fluid tank, and a waste fluid pipe having one end connected to the photoresist waste fluid groove and the other end connected to the waste fluid tank, wherein the waste fluid tank comprises a shape which reduces volatilization of the photoresist waste fluid.

6. A system for waste fluid separation and recovery when coating with a photoresist on a substrate using a fluid, the system comprising:

a first cup in which the substrate is disposed when the substrate is being coated with the photoresist;

a photoresist waste fluid groove in fluid communication with the first cup;

an exhaust airflow generator for generating an exhaust airflow, which guides photoresist waste fluid from the substrate toward the photoresist waste fluid groove; and at least one washing nozzle provided in the waste fluid pipe.

7. A system for waste fluid separation and recovery when coating with a photoresist on a substrate using a fluid, the system comprising:

a first cup in which the substrate is disposed when the substrate is being coated with the photoresist;

a photoresist waste fluid groove in fluid communication with the first cup;

an exhaust airflow generator for generating an exhaust airflow, which guides photoresist waste fluid from the substrate toward the photoresist waste fluid groove; and a system for controlling viscosity of the photoresist waste fluid collected in the waste fluid tank.

8. A spin coater for coating with a photoresist on a substrate using photoresist and rinse liquid, the spin coater comprising:

a chuck adapted for detachably mounting a substrate thereto, the chuck being movable between a first position for applying the photoresist to the substrate when mounted thereto, and a second position for applying the rinse liquid to the substrate;

nozzles disposed for applying the photoresist and rinse liquid to the substrate mounted on the chuck;

first and second cups extending around the chuck, wherein the first and second cups include walls of a height different from one cup to the other, wherein the first cup captures photoresist waste fluid from the substrate when spun at the first position, and the second cup captures rinse waste fluid form the substrate when spun at the second position;

a photoresist waste fluid groove connected by a path of fluid communication with the first cup;

a rinse waste fluid groove connected by a path of fluid communication to the second cup; and an exhaust airflow generator which generates an exhaust airflow that guides the photoresist waste fluid from the substrate toward the photoresist waste fluid groove.

9. The spin coater of claim 8, wherein the second cup includes exhaust holes and the exhaust airflow exits from the first cup through the exhaust holes.

10. The spin coater of claim 9, further comprising a liquid stopper disposed downstream of the exhaust holes, relative to the airflow, for preventing rinse waste fluid from being mixed with the photoresist waste fluid.

11. The spin coater of claim 8, wherein the first cup includes an inner surface that curves toward the substrate.

12. The spin coater of claim 8, wherein the second cup includes an inclined outer surface.

13. The spin coater of claim 8, further comprising a first exhaust duct for discharging the exhaust airflow, and an exhaust valve disposed in the first exhaust duct.

14. The spin coater of claim 13, further comprising a second exhaust duct for discharging exhaust airflow, the second exhaust duct including an entrance for receiving exhaust air that is external to the first cup.

15. The spin coater of claim 8, further comprising a waste fluid tank, and a waste fluid pipe having one end connected to the photoresist waste fluid groove and the other end connected to the waste fluid tank.

16. The spin coater of claim 15, wherein the exhaust airflow is external to the waste fluid tank.

17. The spin coater of claim 15, wherein the waste fluid tank and said other end of the waste fluid pipe form an airtight connection.

18. The spin coater of claim 15, wherein the waste fluid tank has a shape that reduces volatilization of the photoresist waste fluid.

19. The spin coater of claim 15, further comprising at least one washing nozzle provided in the waste fluid pipe.

20. The spin coater of claim 15, further comprising a system for controlling viscosity of the photoresist waste fluid collected in the waste fluid tank.

* * * * *